(12) United States Patent
Wang et al.

(10) Patent No.: US 10,574,189 B2
(45) Date of Patent: Feb. 25, 2020

(54) AMPLIFIER CIRCUITRY, VOLTAGE REGULATOR CIRCUIT, AND SIGNAL COMPENSATION METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ju-Chieh Wang, Hsinchu (TW); Yi-Lin Lee, Hsinchu (TW); Yen-Chung Chen, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/157,079

(22) Filed: Oct. 10, 2018

(65) Prior Publication Data
US 2019/0363678 A1 Nov. 28, 2019

(30) Foreign Application Priority Data

May 23, 2018 (TW) .............................. 107117616 A

(51) Int. Cl.
*H03F 3/45* (2006.01)
*H03F 1/30* (2006.01)

(52) U.S. Cl.
CPC ......... *H03F 1/301* (2013.01); *H03F 3/45183* (2013.01); *H03F 3/45744* (2013.01); *H03F 2200/21* (2013.01); *H03F 2200/375* (2013.01); *H03F 2203/45022* (2013.01); *H03F 2203/45111* (2013.01); *H03F 2203/45151* (2013.01); *H03F 2203/45244* (2013.01); *H03F 2203/45258* (2013.01); *H03F 2203/45322* (2013.01); *H03F 2203/45354* (2013.01); *H03F 2203/45361* (2013.01); *H03F 2203/45374* (2013.01)

(58) Field of Classification Search
CPC ......... H03F 3/04; H03F 3/45; H03F 2200/447
USPC ......................................... 330/252, 256, 261
See application file for complete search history.

(56) References Cited

U.S. PATENT DOCUMENTS 3,740,658 A * 6/1973 Loving, Jr. ......... H03F 3/45479
330/256

* cited by examiner

*Primary Examiner* — Steven J Mottola
(74) *Attorney, Agent, or Firm* — CKC & Partners Co., LLC

(57) ABSTRACT

An amplifier circuitry includes a current source circuit, a voltage regulator circuit, and an amplifier. The current source circuit generates a first bias current. The voltage regulator circuit regulates a reference voltage to generate a supply voltage. The voltage regulator circuit includes a first and a second compensation resistors, the first and the second compensation resistors are configured to generate the reference voltage according to a reference a second bias currents, and a first ratio is present between the first and the second biasing currents. The amplifier includes first load resistors which are configured to generate a first common-mode output signal based on the supply voltage and the first bias current. The second ratio is present between the second compensation resistor and one of the first load resistors, and the first and the second ratios are arranged to compensate the first common-mode output signal.

20 Claims, 4 Drawing Sheets

US 10,574,189 B2

AMPLIFIER CIRCUITRY, VOLTAGE REGULATOR CIRCUIT, AND SIGNAL COMPENSATION METHOD

This application claims priority to Taiwanese Application Serial Number 107117616, filed May 23, 2018, which is herein incorporated by reference in its entirety.

BACKGROUND

Technical Field

The present disclosure relates to an amplifier circuitry. More particularly, the present disclosure relates to an amplifier circuitry having a regulator circuit for common-mode signal compensation.

Description of Related Art

Amplifiers are commonly used in a lot of technologies. The amplifier is configured to amplify a received signal to generate an output signal. However, an output of an amplifier circuitry is affected by various variables in the environment (for example, temperature, especially for the temperature of the progress of manufacturing integrated circuits). As a result, an offset may be introduced to the output of the amplifier.

SUMMARY

Some aspects of the present disclosure provide an amplifier circuitry includes a current source circuit, a voltage regulator circuit, and the first amplifier. The current source circuit generates a first bias current. The voltage regulator circuit regulates a reference voltage to generate a supply voltage. The voltage regulator circuit includes a first compensation resistor and a second compensation resistor that generates the reference voltage according to a reference current and a second bias current. A ratio of the second bias current to the first biasing current is a first ratio. The first amplifier includes first load resistors that are configured to generate a first common-mode output signal based on the supply voltage and the first bias current. A ratio of the second compensation resistor to the first load resistor is a second ratio. The first ratio and the second ratio are arranged to compensate the first common-mode output signal.

Some aspects of the present disclosure provide a voltage regulator circuit which is configured to compensate a common-mode output signal generated by an amplifier circuit through two load resistors, wherein the amplifier circuit is biased by a supply voltage and a first bias current. The voltage regulator circuit includes a first compensation resistor, a second compensation resistor, and a regulator. The first compensation resistor is configured to receive a reference current. The second compensation resistor is coupled between the first compensation resistor and a ground, and the second compensation resistor is configured to cooperate with the first compensation resistor to generate a reference current according to a second bias current and the reference current. A first ratio is present between the second bias current and the first bias current, a second ratio is present between the second compensation resistor and one of the load resistors, and the first ratio and the second ratio are arranged to compensate the common-mode output signal. The regulator is configured to adjust the reference voltage to generate the supply voltage.

Some aspects of the present disclosure provide a method includes generating a first bias current by a current source circuit, generating a supply voltage by a voltage regulator circuit adjusting a reference voltage, and generating a first common-mode output signal by a first amplifier. The voltage regulator circuit includes a first compensation resistor and a second compensation resistor. The first compensation resistor and the second compensation resistor are configured to generate the reference voltage according to a reference circuit and a second bias current, and a first ratio is present between the second bias current and the first bias current. The first amplifier includes first load resistors, the first resistors are configured to generate the first common-mode output signal according to the supply voltage and the first bias current. A second ratio is present between the second compensation resistor and one of the first load resistors, and the first ratio and the second ratio are arranged to compensate the first common-mode output signal.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
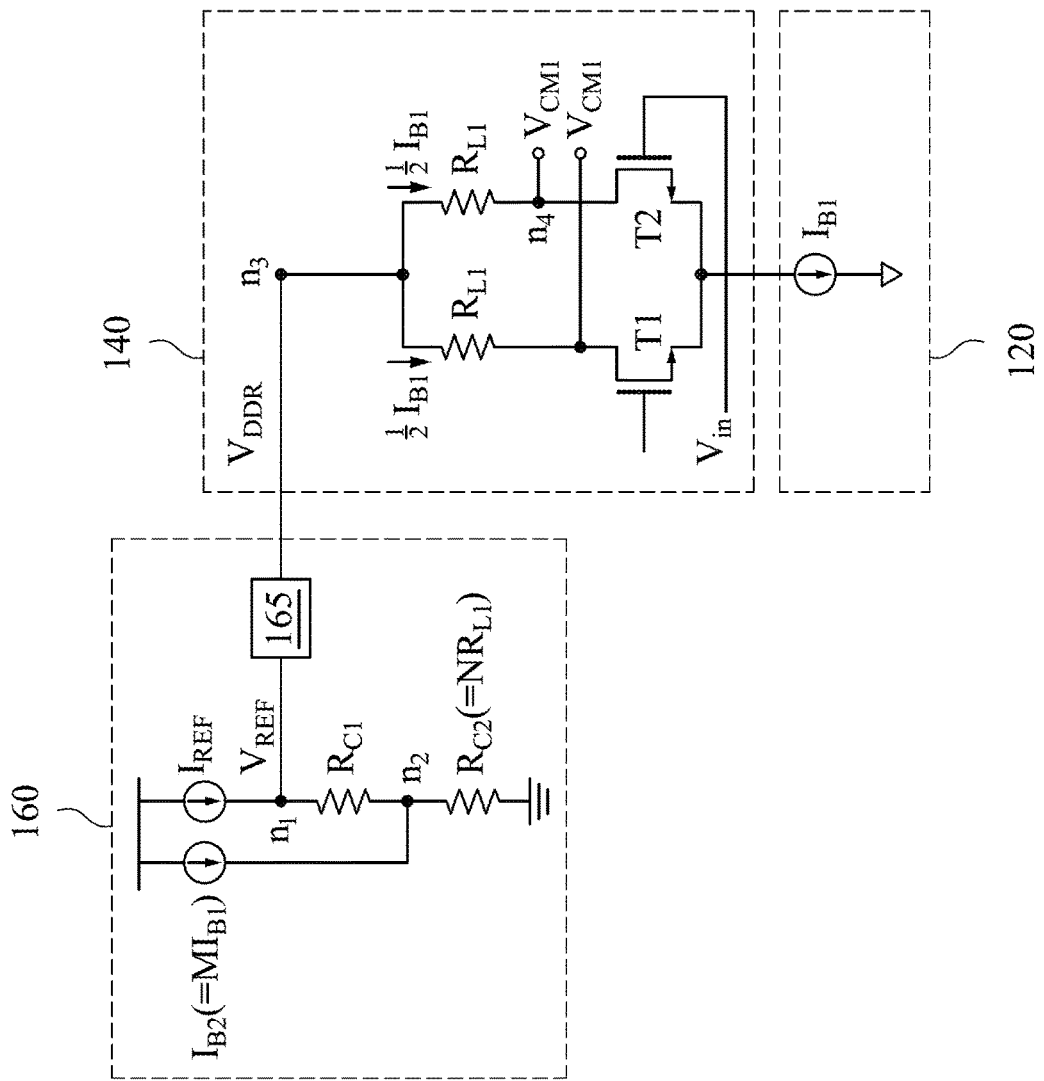
FIG. 1 is a schematic diagram of an amplifier circuitry, according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In the present disclosure, the term "circuitry" generally indicates a system including one or more circuits. The term "circuit" generally indicates devices including one or more transistors and/or one or more active unit connected in a particular configuration to process the signal.

Reference is made to FIG. 1. FIG. 1 is a schematic diagram of an amplifier circuitry 100, according to some embodiments of the present disclosure. In some embodiments, a current source circuit 120 is configured to provide a first bias current $I_{B1}$ to a first amplifier circuit 140, and a voltage regulator circuit 160 is configured to provide a supply voltage $V_{DDR}$ to the first amplifier circuit 140. Accordingly, the first amplifier circuit 140 is able to be biased according to the first bias current $I_{B1}$ and the supply voltage $V_{DDR}$. In this situation, the first amplifier circuit 140 is able to output a first common-mode output signal $V_{CM1}$ in response to an input signal $V_{in}$.

In some embodiments, the input signal $V_{in}$ has a direct current (DC) signal component (such as the common-mode input voltage) and an alternating current (AC) signal component. In some embodiments, the first amplifier circuit 140 is able to be biased by the first bias current $I_{B1}$, the supply voltage $V_{DDR}$, and the DC signal component of the input signal $V_{in}$ to amplify the AC signal component of the input signal $V_{in}$, so as to generate an output signal (not shown). In some embodiments, the first common-mode output signal $V_{CM1}$ is a DC signal component of the output signal of the first amplifier circuit 140.

In some embodiments, the amplifier circuitry 100 further includes an AC-coupled circuit (not shown). The AC-coupled circuit is configured to provide a DC bias voltage to gates of the transistors T1-T2, and configured to transmit the input signal $V_{in}$ (in such embodiment, the input signal $V_{in}$ is an AC signal) to the transistors T1-T2. In some embodiments, the AC-coupled circuit described above is able to be implemented with, but not limited to, one or more resistive units, capacitive units, and a bias circuit.

For illustration in FIG. 1, in some embodiments, the first amplifier circuit 140 includes two first load resistors $R_{L1}$ and two transistors T1-T2. In some embodiments, these first load resistors $R_{L1}$ have the same resistance. First terminals of these first load resistors $R_{L1}$ are coupled to the voltage regulator circuit 160 to receive the supply voltage $V_{DDR}$. Second terminals of these first load resistors $R_{L1}$ are coupled to first terminals of the transistors T1 and T2 respectively, so as to output the first common-mode output signal $V_{CM1}$. Second terminals of the transistors T1-T2 are coupled to the current source circuit 120. The gates of the transistors T1-T2 are configured to receive the input signal $V_{in}$.

In some embodiments, the transistors T1-T2 are arranged as a differential input pairs. The transistors T1-T2 have identical feature size. In this situation, when the transistors T1-T2 are turned on according to the input signal $V_{in}$, half of the first bias current $I_{B1}$ passes through the transistor T1 or the transistor T2. Due to the same reason, the half of the first bias current $I_{B1}$ also passes through each of the first load resistors $R_{L1}$. Hence, when the transistors T1-T2 are turned on, these first load resistors $R_{L1}$ are able to generate the first common-mode output signal $V_{CM1}$ based on the supply voltage $V_{DDR}$ and the first bias current $I_{B1}$.

In some embodiments, the current source circuit 120 includes a current mirror circuit (not shown). For example, the current source circuit 120 is implemented with a constant-gm (constant-transconductance) current mirror circuit. The implementations of the current source circuit 120 are given for illustrative purposes only, and various elements to implement the current source circuits 120 are within the contemplated scope of the present disclosure.

In some embodiments, the voltage regulator circuit 160 is able to regulate the reference voltage $V_{REF}$ to generate supply voltage $V_{DDR}$. The reference voltage $V_{REF}$ is generated by one or more resistive units and one or more bias current.

For example, in some embodiments, the voltage regulator circuit 160 includes a first compensation resistor $R_{C1}$, a second compensation resistor $R_{C2}$, and a regulator 165. A first terminal (i.e., node $n_1$) of the first compensation resistor $R_{C1}$ is configured to receive the reference current $I_{REF}$. A second terminal of the first compensation resistor $R_{C1}$ is coupled to a first terminal (i.e., node $n_2$) of the second compensation resistor $R_{C2}$. The first terminal of the second compensation resistor $R_{C2}$ is configured to receive the second bias current $I_{B2}$. The second terminal of the second compensation resistor $R_{C2}$ is coupled to ground. The first terminal of the first compensation resistor $R_{C1}$ is configured to generate the reference voltage $V_{REF}$. The first compensation resistor $R_{C1}$ and the second compensation resistor $R_{C2}$ are configured to generate the supply voltage $V_{REF}$ according to the reference current $I_{REF}$ and the second bias current $I_{B2}$.

The regulator 165 is coupled to the first terminal of the first compensation resistor $R_{C1}$ to receive the reference voltage $V_{REF}$. The regulator 165 is configured to regulate the reference voltage $V_{REF}$ to generate the supply voltage $V_{DDR}$ at the node $n_3$. In some embodiments, the reference voltage $V_{REF}$ is about equal to the supply voltage $V_{DDR}$. In some other embodiments, the voltage regulator circuit 160 may exclude the regulator 165, such that the voltage regulator circuit 160 outputs the reference voltage $V_{REF}$ as the supply voltage $V_{DDR}$ directly.

In some embodiments, the reference current $I_{REF}$ is the current generated by a bandgap reference circuit. In some embodiments, the current generated by the bandgap reference circuit is substantially free of impacts from environmental parameters (such as temperature). Various elements or circuits to implement the reference current $I_{REF}$ are within the contemplated scope of the present disclosure.

In some embodiments, the second bias current $I_{B2}$ may be divided from the current of the current mirror (not shown) of the current source circuit 120. Various circuits to implement second bias current $I_{B2}$ are within the contemplated scope of the present disclosure.

In some embodiments, a first ratio M is present between the second bias current $I_{B2}$ and first bias current $I_{B1}$, which may be derived as the following equation (1):

$$I_{B2}=M \times I_{B1} \tag{1}$$

In some embodiments, the first ratio M is arranged to be smaller than 1.

In some embodiments, a second ratio N is present between the second compensation resistor $R_{C2}$ and the first compensation resistor $R_{C1}$, which may be derived as the following equation (2):

$$R_{C2}=N \times R_{L1} \tag{2}$$

In some embodiments, the reference voltage $V_{REF}$ is able to be derived from the following equation (3):

$$V_{REF}=MI_{B1} \times NR_{L1}+I_{REF}(R_{C1}+NR_{L1}) \tag{3}$$

The reference voltage $V_{REF}$ is the voltage on the node $n_1$.

As mentioned above, in some embodiments, the reference voltage $V_{REF}$ is about equal to the supply voltage $V_{DDR}$ (i.e., the voltage on the node $n_1$ is equal to the voltage on the node $n_3$). As such, when the transistors T1-T2 are turned on, the voltage of the first common-mode output signal $V_{CM1}$ is able to be derived as the following equation (4) according to the equation (1) and the equation (3):

$$V_{CM1}=V_{DDR}-0.5 \times I_{B1} \times R_{L1} \tag{4}$$

According to equation (4), the first load resistor $R_{L1}$ may generate the first common-mode output signal $V_{CM1}$ based on the supply voltage $V_{DDR}$ and the first bias current $I_{B1}$.

The following equation (5) is able to be derived by substituting the equation (3) into the equation (4):

$$V_{CM1}=I_{B1}(MNR_{L1}-0.5R_{L1})+I_{REF}(R_{C1}+NR_{L1}) \tag{5}$$

In some embodiments, the first ratio M and the second ratio N are arranged to compensate the first common-mode output signal $V_{CM1}$. For example, if M is set to ⅛ and the N is set to 4, the product of M and N is equal to 0.5. As such, the above equation (5) is represented as followed:

$$V_{CM1}=I_{REF}(R_{C1}+NR_{L1}) \quad (6)$$

The above values of the first ration M and the second ratio N are given for the explanation purposes. Various values able to be applied to embodiments discussed herein are within the contemplated scope of the present disclosure.

In some approaches, the common-mode output voltage of the amplifier circuit (for example, the common-mode output signal $V_{CM1}$ in FIG. 1) are directly correlated with the bias current (for example, the first bias current $I_{B1}$ in FIG. 1). In these approaches, as an offset may be introduced due to impacts from various variations (e.g., process, voltage, and temperature variations) on the bias current, an offset may be introduced to the common-mode output voltage of the amplifier as well. Therefore, the accuracy of the amplifier is decreased, or the amplifier fails to function normally.

Compared to the above approaches, according to the equation (6), with the voltage regulator circuit 160 in the present disclosure, the first common-mode output signal $V_{CM1}$ is able to be independent from the first bias current $I_{B1}$. As a result, no offset will be introduced to the first common-mode output signal $V_{CM1}$ from the variations of the first bias current $tI_{B1}$. Alternatively stated, in the present disclosure, the effect of the variation of the first bias current $I_{B1}$ on the first common-mode output signal $V_{CM1}$ can be compensated by arranging the first ratio M and the second ratio N.

In addition, according to equation (6), the first common-mode output signal $V_{CM1}$ is correlated with the reference current $I_{REF}$ only. As mentioned above, the reference current $I_{REF}$ is the current generated by the bandgap reference circuit, and is difficult to be affected by the environment variation. The first common-mode output signal $V_{CM1}$ thus is more stable.

Figure 2:
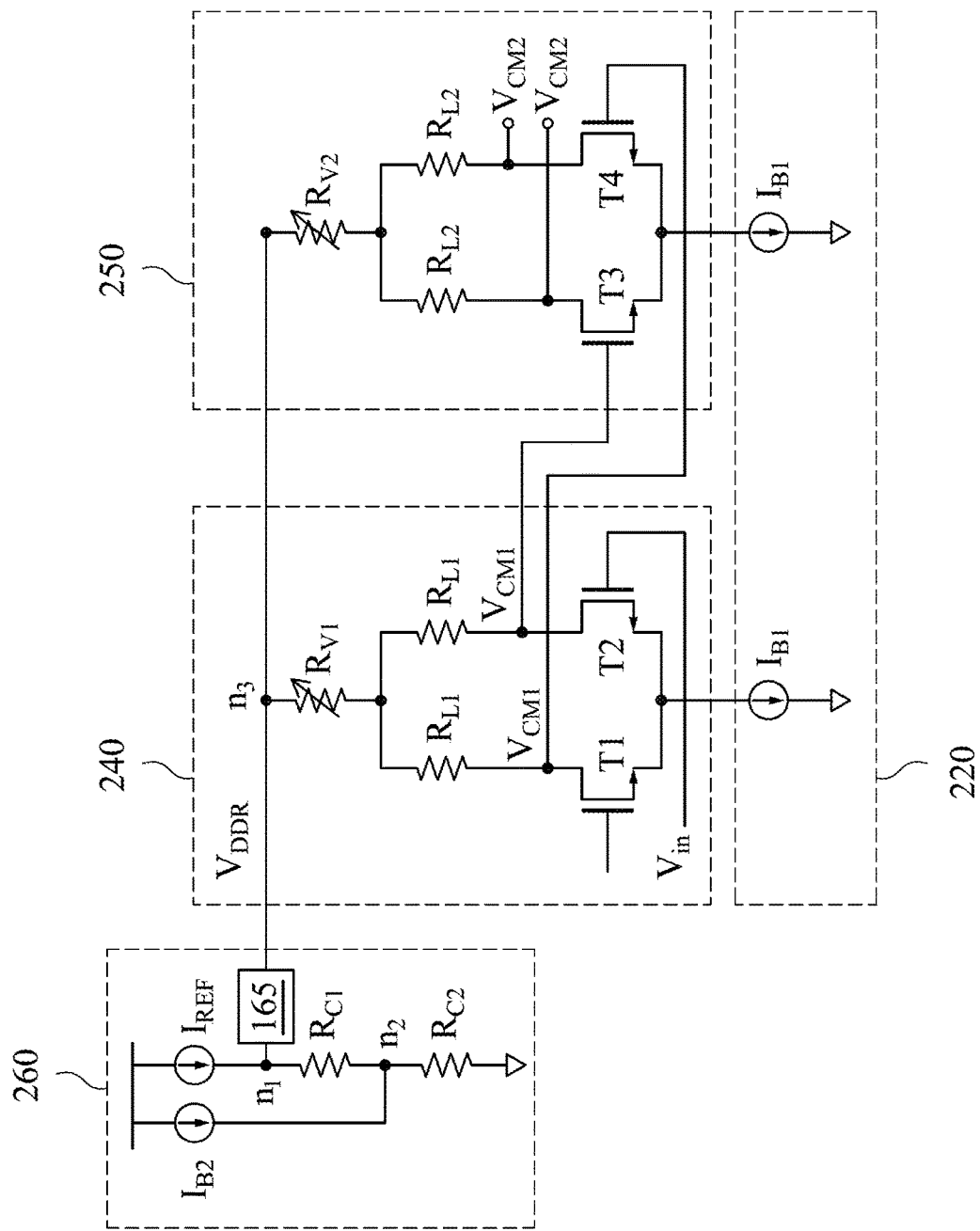
FIG. 2 is a schematic diagram of an amplifier circuitry, according to some embodiments of the present disclosure.

Reference is made to FIG. 2. FIG. 2 is a schematic diagram of an amplifier circuitry 200, according to some embodiments of the present disclosure. With respect to the embodiments of FIG. 1, like elements in FIG. 2 are designated with the same reference numbers for ease of understanding.

Compared to the embodiments in FIG. 1, the amplifier circuitry 200 in FIG. 2 includes a first amplifier circuit 240 and a second amplifier circuit 250. In some embodiments, the current source circuit 220 is configured to provide the first bias current $I_{B1}$ to the first amplifier circuit 240 and the second amplifier circuit 250, and the voltage regulator circuit 260 is configured to provide supply voltage $V_{DDR}$ to the first amplifier circuit 240 and the second amplifier circuit 250. Thus, the bias conditions of the first amplifier circuit 240 and the second amplifier circuit 250 can be arranged according to the first bias current $I_{B1}$ and the supply voltage $V_{DDR}$. In this situation, the first amplifier circuit 240 is able to generate the first common-mode output signal $V_{CM1}$ in response to the input signal $V_{in}$, and the second amplifier circuit 250 is able to generate the second common-mode output signal $V_{CM2}$ in response to the first common-mode output signal $V_{CM1}$. Compared to the embodiments in FIG. 1, with the second amplifier circuit 250, the amplifier circuitry 200 has higher gain.

Compared to the first amplifier circuit 140 in FIG. 1, the first amplifier circuit 240 in FIG. 2 further includes a first variable resistor $R_{V1}$. In some embodiments, the first variable resistor $R_{V1}$ and the first load resistors $R_{L1}$ are configured to generate the first common-mode output signal $V_{CM1}$ based on the supply voltage $V_{DDR}$ and the first bias current $I_{B1}$.

A first terminal of the first variable resistor $R_{V1}$ is coupled to the voltage regulator circuit 260, and a second terminal of the first variable resistor $R_{V1}$ is coupled to first terminals of the first load resistors $R_{L1}$. Second terminals of the first load resistors $R_{L1}$ are configured to output the first common-mode output signal $V_{CM1}$, and are coupled to first terminals of the transistor T1-T2 respectively. Second terminals of the transistor T1-T2 are coupled to the current source circuit 220. Control terminals of the transistors T1-T2 are configured to receive the input signal $V_{in}$.

In such embodiment, the aforementioned equation (5) can be rewritten as a following equation (7):

$$V_{CM1}=I_{B1}(MNR_{L1}-R_{V1}-0.5R_{L1})+I_{REF}(R_{C1}+NR_{L1}) \quad (7)$$

According to equation (7), when the coefficient ($MNR_{L1}-R_{V1}-0.5R_{L1}$) associated with the first bias current $I_{B1}$ is positive, the first common-mode output signal $V_{CM1}$ is positive correlated with the first bias current $I_{B1}$. Alternatively, in alternative embodiments, when the coefficient ($MNR_{L1}-R_{V1}-0.5R_{L1}$) associated with the first bias current $I_{B1}$ in the equation (7) is negative, the first common-mode output signal $V_{CM1}$ is negative correlated with the first bias current $I_{B1}$. In some other embodiments, the coefficient ($MNR_{L1}-R_{V1}-0.5R_{L1}$) associated with the first bias current $I_{B1}$ in the equation (7) is set to 0, in order to cancel the offset, which is introduced from the first bias current $I_{B1}$, on the first common-mode output signal $V_{CM1}$.

Alternatively stated, in the embodiment, the first variable resistor $R_{V1}$ cooperating with those first load resistors $R_{L1}$ is arranged to adjust the first common-mode output signal $V_{CM1}$. The relevancy of the first common-mode output signal $V_{CM1}$ and the first bias current $I_{B1}$ is able to adjust more flexibly by this arrangement in the above embodiment. Therefore, the first variable resistor $R_{V1}$ is adjusted according to the reality to compensate the offset of the first common-mode output signal $V_{CM1}$.

Reference is continuously made to FIG. 2. For illustration in FIG. 2, in some embodiments, the second amplifier circuit 250 includes two second load resistors $R_{L2}$, a second variable resistor $R_{V2}$, and two transistors T3-T4. A first terminal of the second variable resistor $R_{V2}$ is coupled to the voltage regulator circuit 260. A second terminal of the second variable resistor $R_{V2}$ is coupled to first terminals of those second load resistors $R_{L2}$. Second terminals of those second load resistor $R_{L2}$ are configured to output the second common-mode output signal $V_{CM2}$, and are coupled to first terminals of the transistors T3-T4 respectively. Second terminals of the transistors T3-T4 are coupled to the current source circuit 220. Gates of the transistors T3-T4 are configured to receive the first common-mode output signal $V_{CM1}$ respectively. The second variable resistor $R_{V2}$ and those second load resistors $R_{L2}$ are configured to generate the second common-mode output signal $V_{CM2}$ based on the supply voltage $V_{DDR}$ and the first bias current $I_{B1}$. The arrangement of the second amplifier circuit 250 can be understood with reference to the arrangement of the aforementioned first amplifier circuit 240, and thus the repetitious descriptions are not given herein.

In addition, in each embodiment, the first variable resistor $R_{V1}$ and the second variable resistor $R_{V2}$ can be selectively arranged. For example, in some embodiments, the second amplifier circuit 250 does not include the second variable resistor $R_{V2}$. Alternatively, in some embodiments, the first amplifier circuit 240 includes the first variable resistor $R_{V1}$, and the second amplifier circuit 250 does not include the second variable resistor $R_{V2}$. The above arrangements are given for the illustration purposes. Various arrangements are within the contemplated scope of the present disclosure.

Figure 3:
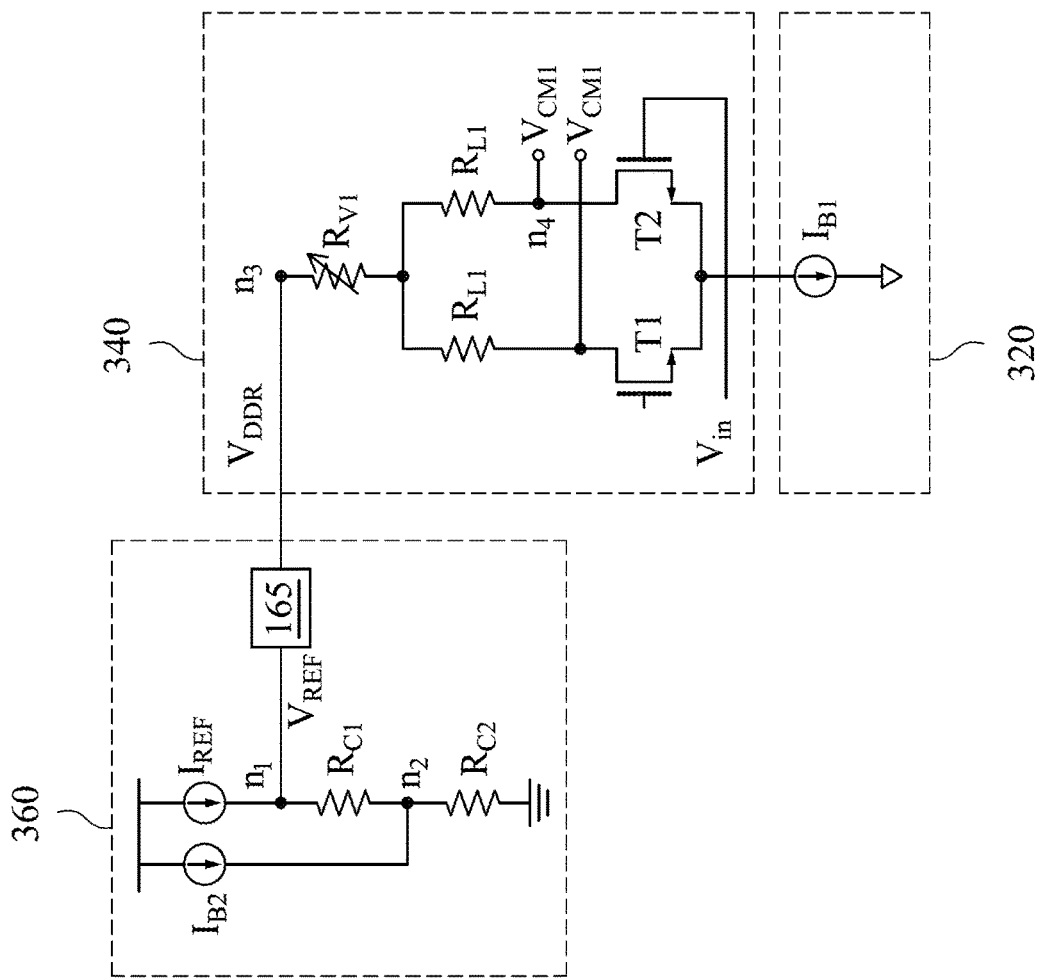
FIG. 3 is a schematic diagram of an amplifier circuitry, according to some embodiments of the present disclosure.

Reference is made to FIG. 3. FIG. 3 is a schematic diagram of an amplifier circuitry 300, according to some embodiments of the present disclosure. With respect to the embodiments of FIG. 2, like elements in FIG. 3 are designated with the same reference numbers for ease of understanding.

Compared to the embodiments in FIG. 2, the amplifier circuitry 300 in FIG. 3 only includes the first amplifier circuit 340. Alternatively stated, in each embodiment, various numbers of the amplifier circuit stages are within the contemplate scope of the present disclosure. In some embodiments, the first amplifier circuit 340 is similar to the first amplifier circuit 140 in FIG. 1, the first amplifier circuit 240 in FIG. 2, and the second amplifier circuit 250 in FIG. 2, thus the description will not repeat again.

It is noted that the amount of the load resistors and that of the variable resistors in FIGS. 1-3 are given for illustration purposes. Various numbers of the load resistors and various numbers of the variable resistors are within the contemplated scope of the present disclosure.

Figure 4:
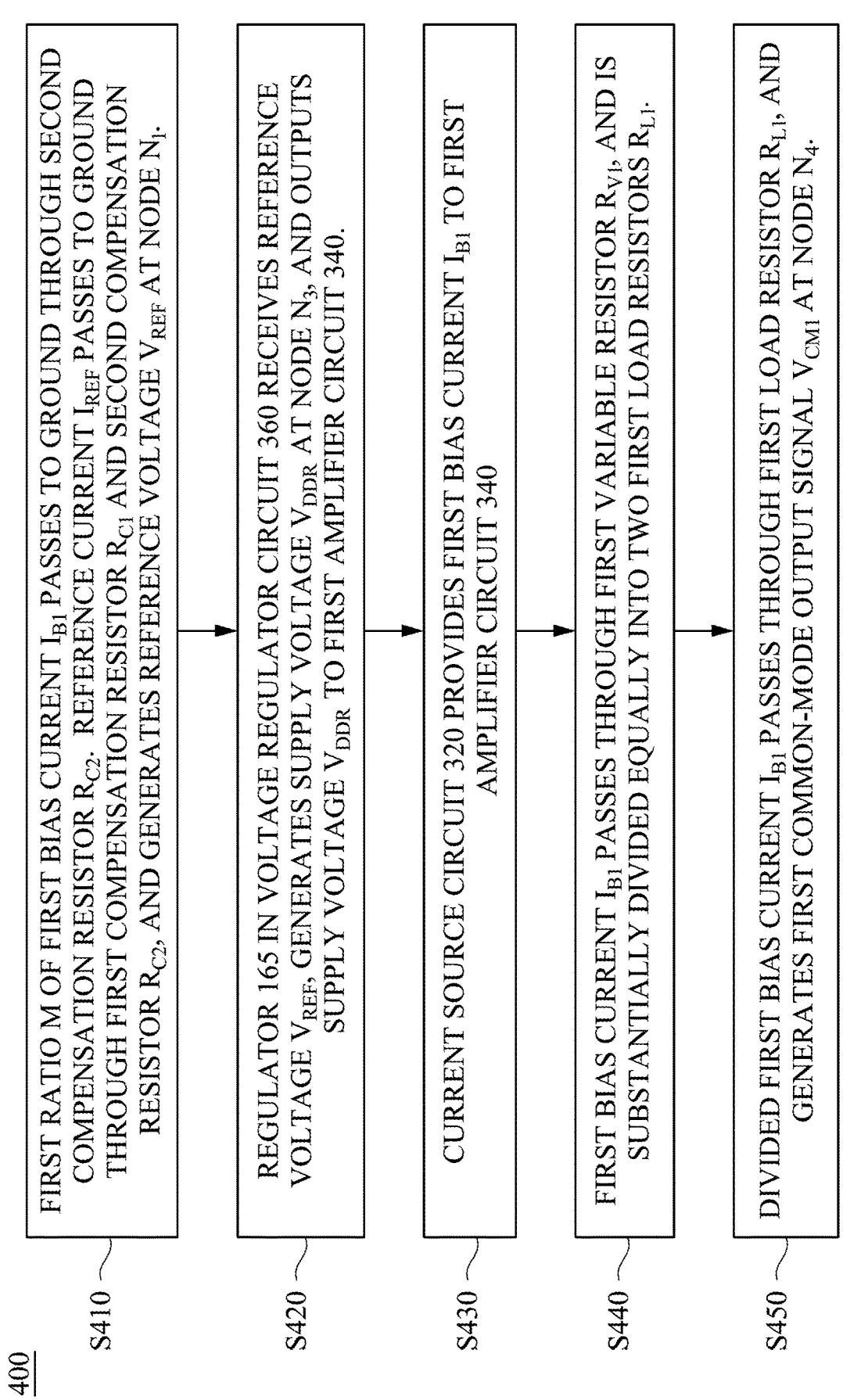
FIG. 4 is a flow chart of a signal compensation method, according to FIG. 3 and some embodiments of the present disclosure.

Reference is made to FIG. 4. FIG. 4 a flow chart of a signal compensation method 400, according to FIG. 3 and some embodiments of the present disclosure. The signal compensation method 400 includes operations S410-S450. In some embodiments, the signal compensation method 400 can be applied to the amplifier circuitry in FIGS. 1-3. The signal compensation method 400 will be discussed with reference, but not limited to, to the amplifier circuitry 300 in FIG. 3 for ease of understanding.

In operation S410, the first ratio M of the first bias current $I_{B1}$ is transmitted to ground through the second compensation resistor $R_{C2}$. The reference current $I_{REF}$ is transmitted to the ground through the first compensation resistor $R_{C1}$ and the second compensation resistor $R_{C2}$. The reference voltage $V_{REF}$ is generated at the node $n_1$ by transmitting part of the first bias current $I_{B1}$ through the aforementioned resistors. The first ratio M is smaller than 1. A second ratio N is present between the second compensation resistor $R_{C2}$ and the first load resistor $R_{L1}$.

In operation S420, the regulator 165 in the voltage regulator circuit 360 receives the reference voltage $V_{REF}$, generates the supply voltage $V_{DDR}$ at the node $n_3$, and outputs the supply voltage $V_{DDR}$ to the first amplifier circuit 340.

In operation S430, the current source circuit 320 provides the first bias current $I_{B1}$ to the first amplifier circuit 340.

In operation S440, the first bias current $I_{B1}$ is transmitted through the first variable resistor $R_{V1}$, and is substantially equally divided into two first load resistors $R_{L1}$.

In operation S450, the divided first bias current $I_{B1}$ is transmitted through the first load resistor $R_{L1}$, and the first common-mode output signal $V_{CM1}$ is generated at the node $n_4$ by transmitting part of the first bias current $I_{B1}$ through the aforementioned resistors.

In some embodiments, the environment (for example, temperature, especially for the temperature of the progress of manufacturing integrated circuits) might affect the first bias current $I_{B1}$, and further affect the first common-mode output signal $V_{CM1}$. In the present disclosure, in order to eliminate the effect of the environment, the same variables of the environment (for example, the first bias current $I_{B1}$) are applied to the supply voltage $V_{DDR}$. In some embodiments, as shown in equation (6), the first common-mode output signal $V_{CM1}$ is independent from the first bias current $I_{B1}$, so that the first common-mode output signal $V_{CM1}$ is independent from the variables of the environment. Hence, the output of the amplifier circuitry is more stable.

In some other embodiments, as shown in equation (7), the first common-mode output signal $V_{CM1}$ can be implemented to correlate with the variables of the environment by applying the aforementioned signal compensation method 400. When the coefficient $(MNR_{L1}-R_{V1}-0.5R_{L1})$ in equation (7) associated with the first bias current $I_{B1}$ is positive, the first common-mode output signal $V_{CM1}$ is positive correlated with the first bias current $I_{B1}$.

In alternative embodiments, when the coefficient $(MNR_{L1}-R_{V1}-0.5R_{L1})$ in equation (7) associated with the first bias current $I_{B1}$ is negative, the first common-mode output signal $V_{CM1}$ is negative correlated with the first bias current $I_{B1}$.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As mentioned above, the common-mode output signal can be free of the offset caused by various variations of the environment (for example, the temperature) by arranging the first ratio, the second ratio, and the variable resistors in the amplifier circuitry provided by the present disclosure. Alternatively, the offset of the common-mode output signal is positive/negative correlated with the variations of the environment (for example, the temperature).

Various functional components or blocks have been described herein. As will be appreciated by persons skilled in the art, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:
1. An amplifier circuitry, comprising:
a current source circuit configured to generate a first bias current;
a voltage regulator circuit configured to regulate a reference voltage to generate a supply voltage, wherein the voltage regulator circuit comprises a first compensation resistor and a second compensation resistor, the first compensation resistor and the second compensation resistor are configured to generate the reference voltage according to a reference current and a second bias current, and a first ratio is present between the second bias current and the first bias current; and a first amplifier comprising a plurality of first load resistors, the plurality of first load resistors configured to generate a first common-mode output signal based on the supply voltage and the first bias current, wherein a second ratio is present between the second compensation resistor and one of the plurality of first load resistors, and the first ratio and the second ratio are arranged to compensate the first common-mode output signal.

2. The amplifier circuitry of claim 1, wherein the first amplifier further comprises:

a variable resistor coupled to the plurality of first load resistors, wherein the variable resistor is configured to receive the supply voltage and to cooperate with the plurality of first load resistors to adjust the first common-mode output signal.

3. The amplifier circuitry of claim 2, wherein the first common-mode output signal is satisfied with a following equation:

$$V_{CM1} = I_{B1}(MNR_{L1}R_{V1} - 0.5R_{L1}) + I_{REF}(R_{C1} + NR_{L1})$$

wherein the $V_{CM1}$ is the first common-mode output signal, the $I_{REF}$ is the reference current, the $R_{C1}$ is a resistance of the first compensation resistor, the $R_{L1}$ is a resistance of one of the plurality of first load resistors, the $I_{B1}$ is the first bias current, the $R_{V1}$ is a resistance of the variable resistor, the M is the first ratio, and the N is the second ratio.

4. The amplifier circuitry of claim 2, wherein the first ratio, the second ratio, and the variable resistor are arranged to cancel an offset related to the first common-mode output signal.

5. The amplifier circuitry of claim 2, wherein the first ratio, the second ratio, and the variable resistor are arranged to set a relevancy of the first common-mode output signal and the first bias current.

6. The amplifier circuitry of claim 1, further comprising:
a second amplifier coupled to the first amplifier, wherein the second amplifier comprises second load resistors configured to generate a second common-mode output signal based on the supply voltage and the first bias current.

7. The amplifier circuitry of claim 6, wherein the second amplifier further comprises:

a variable resistor coupled to the second load resistors, wherein the variable resistor is configured to receive the supply voltage and to cooperate with the second load resistors to adjust the second common-mode output signal.

8. The amplifier circuitry of claim 1, wherein the voltage regulator circuit further comprises:

a regulator configured to generate the supply voltage according to the reference voltage, wherein the first compensation resistor is coupled to the second compensation resistor to generate the reference voltage according to the reference current and the second bias current.

9. The amplifier circuitry of claim 8, wherein a first terminal of the first compensation resistor is configured to receive the reference current and output the reference voltage, a second terminal of the first compensation resistor is configured to couple to a first terminal of the second compensation resistor, the first terminal of the second compensation resistor is configured to receive the second bias current, and a second terminal of the second compensation resistor is configured to couple to a ground.

10. The amplifier circuitry of claim 1, wherein the first common-mode output signal is satisfied with a following equation:

$$V_{CM1} = I_{B1}(MNR_{L1} - 0.5R_{L1}) + I_{REF}(R_{C1} + NR_{L1})$$

wherein the $V_{CM1}$ is the first common-mode output signal, the $I_{REF}$ is the reference current, the $R_{C1}$ is a resistance of the first compensation resistor, the $R_{L1}$ is a resistance of one of the plurality of the first load resistors, the $I_{B1}$ is the first bias current, the M is the first ratio, and the N is the second ratio.

11. The amplifier circuitry of claim 1, wherein the first ratio and the second ratio are arranged to cancel an offset related to the first common-mode output signal.

12. A voltage regulator circuit configured to compensate a common-mode output signal generated by an amplifier circuit through two load resistors, wherein the amplifier circuit is biased by a supply voltage and a first bias current, and the voltage regulator circuit comprises:

a first compensation resistor configured to receive a reference current;

a second compensation resistor coupled between the first compensation resistor and a ground, wherein the second compensation resistor is configured to cooperate with the first compensation resistor to generate a reference voltage according to a second bias current and the reference current, wherein a first ratio is present between the second bias current and the first bias current, a second ratio is present between the second compensation resistor and one of the load resistors, and the first ratio and the second ratio are arranged to compensate the common-mode output signal; and a regulator configured to adjust the reference voltage to generate the supply voltage.

13. A signal compensation method, comprising:
generating a first bias current by a current source circuit;
generating a supply voltage by a voltage regulator circuit adjusting a reference voltage, wherein the voltage regulator circuit comprises a first compensation resistor and a second compensation resistor, the first compensation resistor and the second compensation resistor are configured to generate the reference voltage according to a reference current and a second bias current, and a first ratio is present between the second bias current and the first bias current; and generating a first common-mode output signal by a first amplifier, wherein the first amplifier comprises a plurality of first load resistors, the plurality of first load resistors are configured to generate the first common-mode output signal according to the supply voltage and the first bias current, wherein a second ratio is present between the second compensation resistor and one of the plurality of first load resistors, and the first ratio and the second ratio are arranged to compensate the first common-mode output signal.

14. The signal compensation method of claim 13, wherein generating the first common-mode output signal further comprises:

adjusting the first common-mode output signal by a variable resistor arranging the plurality of first load resistors, wherein the variable resistor is coupled to the plurality of first load resistors and configured to receive the supply voltage.

15. The signal compensation method of claim 14, wherein the first ratio, the second ratio, and the variable resistor are arranged to cancel an offset related to the first common-mode output signal, or arranged to set a relevancy of the first common-mode output signal and the first bias current.

16. The signal compensation method of claim 13, further comprising:
generating a second common-mode output signal by a second amplifier, wherein the second amplifier comprises a plurality of second load resistors, wherein the plurality of second load resistors are configured to generate the second common-mode output signal based on the supply voltage and the first bias current.

17. The signal compensation method of claim 16, wherein generating the second common-mode output signal further comprises:
adjusting the second common-mode output signal by a variable resistor cooperating with the plurality of second load resistors, wherein the variable resistor is coupled to the plurality of second load resistors and configured to receive the supply voltage.

18. The signal compensation method of claim 13, wherein generating the supply voltage further comprises:
generating the supply voltage by a regulator according to the reference voltage, wherein the first compensation resistor is couple to the second compensation resistor to generate the reference voltage according to the reference current and the second bias current.

19. The signal compensation method of claim 18, wherein generating the reference voltage further comprises:
receiving the reference current and outputting the reference voltage by a first terminal of the first compensation resistor, wherein a second terminal of the first compensation resistor is coupled to a first terminal of the second compensation resistor; and
receiving the second bias current by the first terminal of the second compensation resistor, wherein a second terminal of the second compensation resistor is coupled to a ground.

20. The signal compensation method of claim 13, wherein the first ratio and the second ratio are arranged to cancel an offset related to the first common-mode output signal, or arranged to set a relevancy of the first common-mode output signal and the first bias current.

* * * * *